(12) United States Patent
Duan et al.

(10) Patent No.: US 11,372,179 B2
(45) Date of Patent: Jun. 28, 2022

(54) CONNECTOR

(71) Applicant: Dongguan Luxshare Technologies Co., Ltd, Dongguan (CN)

(72) Inventors: Bai-Yu Duan, Dongguan (CN); Xiao-Kai Wang, Dongguan (CN); Xiao-Ping Wu, Dongguan (CN)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 0 days.

(21) Appl. No.: 17/141,530

(22) Filed: Jan. 5, 2021

(65) Prior Publication Data

US 2021/0157075 A1 May 27, 2021

(30) Foreign Application Priority Data

Feb. 28, 2020 (CN) .......................... 202010128239.2

(51) Int. Cl.
*H04B 10/00* (2013.01)
*G02B 6/42* (2006.01)
*H05K 7/20* (2006.01)

(52) U.S. Cl.
CPC ......... *G02B 6/4269* (2013.01); *G02B 6/4246* (2013.01); *G02B 6/4249* (2013.01); *G02B 6/4261* (2013.01); *H05K 7/20409* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,219,238 B1 * | 4/2001 | Andros | ............... | H01L 23/4093 |
| | | | | 24/625 |
| 7,498,673 B2 * | 3/2009 | Awad | .................. | H01L 23/3675 |
| | | | | 257/718 |
| 7,529,094 B2 * | 5/2009 | Miller | .................. | G02B 6/4246 |
| | | | | 165/185 |

(Continued)

FOREIGN PATENT DOCUMENTS

| | | |
|---|---|---|
| CN | 208547748 U | 2/2019 |
| CN | 110249718 A | 9/2019 |
| TW | M72971 U | 2/2014 |

*Primary Examiner* — Agustin Bello
(74) *Attorney, Agent, or Firm* — Birch, Stewart, Kolasch & Birch, LLP

(57) ABSTRACT

A connector includes a cage and a heat-radiation element. A top wall of the cage includes an opening, and first engaging structures extending from the top wall of the cage toward an outside of the cage at a periphery of the opening. The heat-radiation element is disposed on the cage corresponding to the opening, and first notches corresponding to the first engaging structures are disposed on side walls of the heat-radiation element. Each first engaging structure passes through the corresponding first notch to engage the heat-radiation element on the cage. The cage has a receiving cavity and supporting structure at a bottom of the receiving cavity. When a mating connector is inserted into the receiving cavity, a bottom of the mating connector is supported by the supporting structure, a top of the mating connector abuts against the heat-radiation element through the opening, and the heat-radiation element remains substantially stationary.

12 Claims, 10 Drawing Sheets

(56) References Cited

U.S. PATENT DOCUMENTS

| | | | | |
|---|---|---|---|---|
| 7,539,018 B2* | 5/2009 | Murr | H05K 7/20418 | 165/185 |
| 7,974,098 B2* | 7/2011 | Oki | G02B 6/4201 | 361/715 |
| 8,081,470 B2* | 12/2011 | Oki | G02B 6/4246 | 361/715 |
| 8,870,471 B2* | 10/2014 | Ito | G02B 6/4269 | 385/92 |
| 9,992,912 B1* | 6/2018 | Wang | H05K 7/20409 | |
| 10,295,766 B2* | 5/2019 | Chen | G02B 6/4269 | |
| 10,770,842 B2* | 9/2020 | Jin | H01R 13/6582 | |
| 11,177,614 B2* | 11/2021 | Guetig | G02B 6/4277 | |
| 11,199,670 B2* | 12/2021 | Takai | H01R 12/7005 | |
| 2004/0027816 A1* | 2/2004 | Ice | G02B 6/4201 | 361/797 |
| 2005/0195565 A1* | 9/2005 | Bright | H04B 1/036 | 361/688 |
| 2007/0183128 A1* | 8/2007 | Pirillis | H05K 7/20418 | 361/715 |
| 2013/0034992 A1* | 2/2013 | Phillips | H01R 13/6581 | 439/527 |
| 2013/0077254 A1* | 3/2013 | Nguyen | G02B 6/4269 | 361/715 |
| 2013/0108224 A1* | 5/2013 | Ishigami | G02B 6/4249 | 385/89 |
| 2013/0251314 A1* | 9/2013 | Ito | G02B 6/4261 | 385/88 |
| 2014/0153192 A1* | 6/2014 | Neer | H05K 9/0058 | 361/704 |
| 2015/0296638 A1* | 10/2015 | Wu | H05K 7/20409 | 174/548 |
| 2016/0174415 A1* | 6/2016 | Ito | G02B 6/4269 | 361/715 |
| 2019/0230817 A1* | 7/2019 | Han | G02B 6/4269 | |
| 2019/0285817 A1* | 9/2019 | Takai | H05K 9/0058 | |
| 2019/0296493 A1* | 9/2019 | Liu | H01R 13/7172 | |
| 2020/0049912 A1* | 2/2020 | Lu | H01R 13/6581 | |
| 2020/0142142 A1* | 5/2020 | Luo | G02B 6/4278 | |
| 2020/0142143 A1* | 5/2020 | Takai | H01R 12/727 | |
| 2020/0233162 A1* | 7/2020 | Yu | G02B 6/4284 | |
| 2021/0103108 A1* | 4/2021 | Wall, Jr. | H04B 10/40 | |
| 2021/0105025 A1* | 4/2021 | Wall, Jr. | G02B 6/4269 | |
| 2021/0141175 A1* | 5/2021 | Wang | G02B 6/423 | |
| 2021/0157075 A1* | 5/2021 | Duan | H05K 7/20418 | |

* cited by examiner

CONNECTOR

CROSS-REFERENCE TO RELATED APPLICATION

This non-provisional application claims priority under 35 U.S.C. § 119(a) to Patent Application No. 202010128239.2 filed in China, P.R.C. on Feb. 28, 2020, the entire contents of which are hereby incorporated by reference.

BACKGROUND

Technical Field

The present invention relates to a connector, in particular to a pluggable connector.

Related Art

Various input/output (I/O) connectors are known. Some common types of connectors include a small form-factor pluggable (SFP) connector, a 10-Gigabit small form factor pluggable (XFP) connector, a quad small form-factor pluggable (QSFP) connector and a C form-factor pluggable (CXP) connector. The pluggable connectors such as the SFP connector, the XFP connector, the QSFP connector and the CXP connector have the advantages of small size and low power consumption and thus are widely applied to the field of electrical and optical communication in telecommunication and data communication. When a mating connector is plugged into a pluggable connector, an optical transceiver module in the pluggable connector generates a large amount of heat, so that the temperature of the connector rises quickly, which further affects the stability and reliability of operation of the connector. Especially, when the demand for the data transmission volume of the connector is gradually increased with the development of technology, the heat radiation efficiency of a traditional heat radiation way of the connector through heat-radiation holes cannot effectively eliminate the problem of overheat of the connector.

SUMMARY

In view of the above problem, the present invention provides a connector. The connector quickly dissipates a large amount of heat energy generated during using of the connector into air through heat-radiation elements so as to solve the problem of insufficient heat-radiation efficiency in the prior art. Hereupon, the present invention provides a connector. As for the connector, the heat-radiation elements are fixed to a cage through engaging structures directly formed on a cage body and notches in heat-radiation element bodies, in this way, increasing an overall cost of the connector due to additional fixing parts can be avoided, and a displacement degree of the heat-radiation elements can further be lowered so as to avoid affecting a heat radiation effect and/or an effect of restraining electromagnetic interference (EMI). Moreover, the present invention provides the connector. The heat-radiation elements remain substantially stationary when tops of docking connectors of the connector abut against the heat-radiation elements through openings in the cage, in this way, good contact can be provided for the heat-radiation elements and the docking connectors to improve the heat radiation effect, and the effect of the overall connector on restraining EMI can be further improved.

In one embodiment, a connector includes a cage and a heat-radiation element. A top wall of the cage includes an opening, and a plurality of first engaging structures extending from the top wall of the cage toward an outside of the cage at a periphery of the opening. The heat-radiation element is disposed on the top wall of the cage corresponding to the opening. A plurality of first notches corresponding to the first engaging structures are disposed on side walls of the heat-radiation element. Each first engaging structure passes through the corresponding first notch to engage the heat-radiation element on the top wall of the cage. The cage includes a receiving cavity allowing a mating connector to be inserted, and a supporting structure disposed at a bottom of the receiving cavity. When the mating connector is inserted into the receiving cavity, a bottom of the mating connector is supported by the supporting structure, a top of the mating connector abuts against the heat-radiation element through the opening, and the heat-radiation element remains substantially stationary.

In some embodiments, the heat-radiation element includes a contact element extending into the opening. Moreover, when the mating connector is inserted into the receiving cavity, the top of the mating connector abuts against the contact element through the opening.

In some embodiments, a thickness of the contact element is 0.25 mm to 0.6 mm.

In some embodiments, the supporting structure is formed by extending of a bottom wall of the cage towards the receiving cavity.

In some embodiments, the cage includes an upper cage and a lower cage. The first engaging structures extend from the upper cage, and the supporting structure extends from the lower cage.

In some embodiments, each first engaging structure includes an upward structure extending upwards from the top wall of the cage and a bent sheet structure extending from the upward structure. Moreover, when the heat-radiation element is disposed on the top wall of the cage, the upward structures are correspondingly disposed in the first notches, and the bent sheet structures are crimped with top surfaces of the heat-radiation element.

In some embodiments, at least one second engaging structure further extends from the top wall of the cage toward the outside of the cage at the periphery of the opening. Each second engaging structure is adjacent to one of the first engaging structures. The side walls of the heat-radiation element are further provided with at least one second notch corresponding to the at least one second engaging structure. Each second engaging structure passes through the corresponding second notch to be crimped with the bent sheet structure of the adjacent first engaging structure.

In some embodiments, at least one second engaging structure further extends from the top wall of the cage toward the outside of the cage at the periphery of the opening. Each second engaging structure is adjacent to one of the first engaging structures. The side walls of the heat-radiation element are further provided with at least one second notch corresponding to the at least one second engaging structure. Each second engaging structure includes a first sheet structure extending upwards from the top wall of the cage and a second sheet structure extending from the first sheet structure. When the heat-radiation element is disposed on the top wall of the cage, the first sheet structures pass through the corresponding second notches to be twisted, so that side wings of the second sheet structures are engaged on the corresponding bent sheet structures.

In some embodiments, all the first engaging structures are snap structures extending upwards from the top wall of the cage, and all the snap structures are engaged by the corresponding first notches.

In some embodiments, the cage includes another receiving cavity allowing another mating connector to be inserted and configured in parallel with the receiving cavity. The top wall of the cage includes another opening enabling the outside of the cage and the another receiving cavity to communicate. The connector further includes another heat-radiation element located on the top wall of the cage corresponding to the another opening.

In some embodiments, the at least one first engaging structure is located between the two openings. Each of the at least one first engaging structure includes an upward structure extending upwards from the top wall of the cage and a bent sheet structure extending from the upward structure. The bent sheet structure of the at least one first engaging structure is simultaneously crimped with top surfaces of the two heat-radiation elements corresponding to the two openings.

DETAILED DESCRIPTION

It should be noted that, orientation or position relationships indicated by the terms such as "upper", "lower", "left", "right", "vertical", "horizontal", "inside", and "outside" are based on orientation or position relationships shown in the accompanying drawings or are orientation or position relationships commonly used when a creative product of any embodiment is used, and are used only for ease of describing implementation aspects of the present invention and simplifying the description, rather than indicating or implying that the mentioned apparatus or component needs to have a particular orientation or needs to be constructed and operated in a particular orientation. Therefore, such terms should not be construed as a limitation on the present invention. In addition, the terms such as "first", "second", and "third" are used only to distinguish descriptions, and should not be understood as indicating or implying relative importance. In the description of the present invention, unless stated otherwise, the meaning of "a plurality of" is two or more than two.

It should be further noted that, unless otherwise explicitly specified or defined, a first feature being located "above" or "below" a second feature may be the first feature being in a direct contact with the second feature, or the first feature being in an indirect contact with the second feature through another feature.

Figure 1:
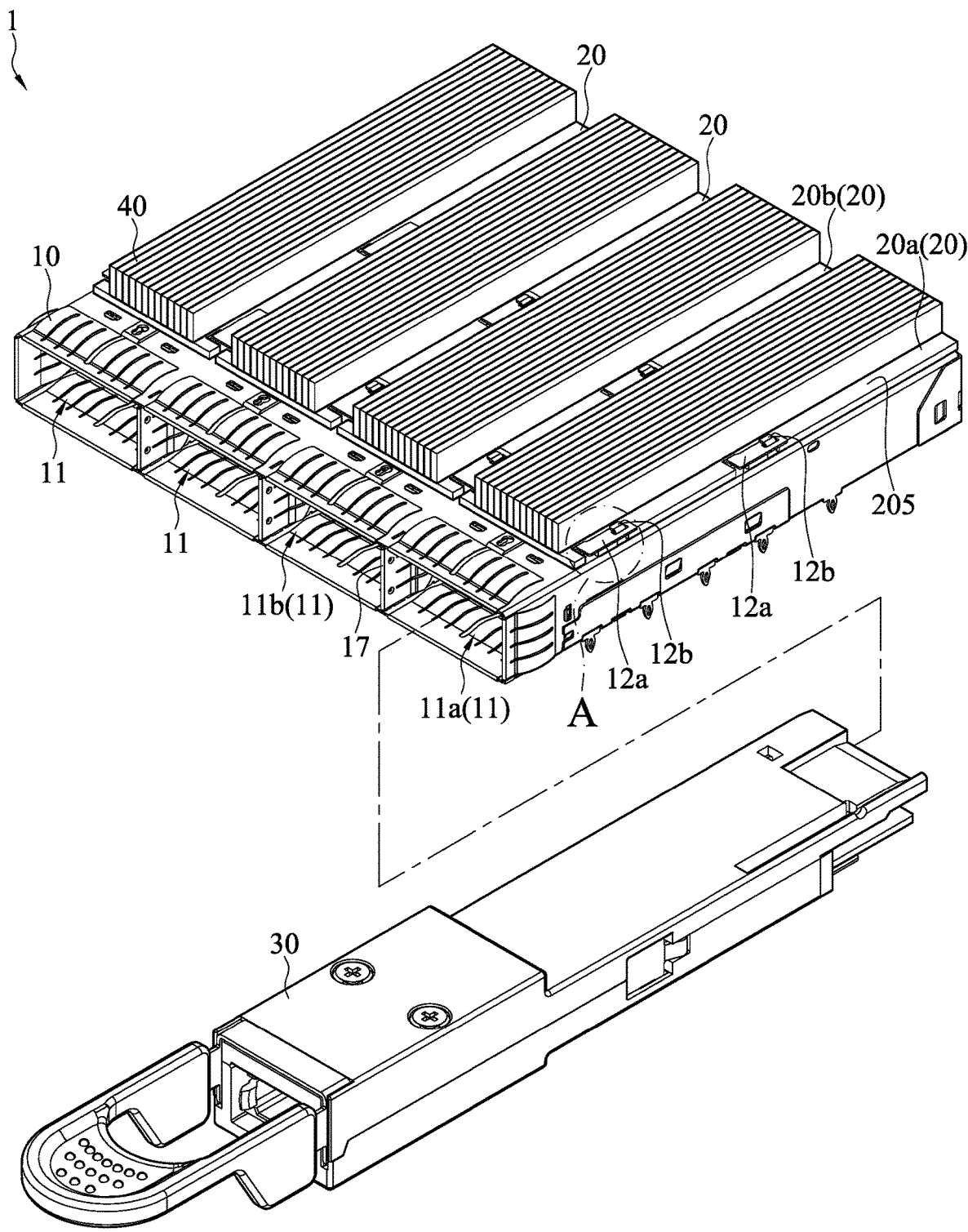
FIG. 1 is a schematic stereoscopic diagram of a connector of an embodiment.
Figure 2:
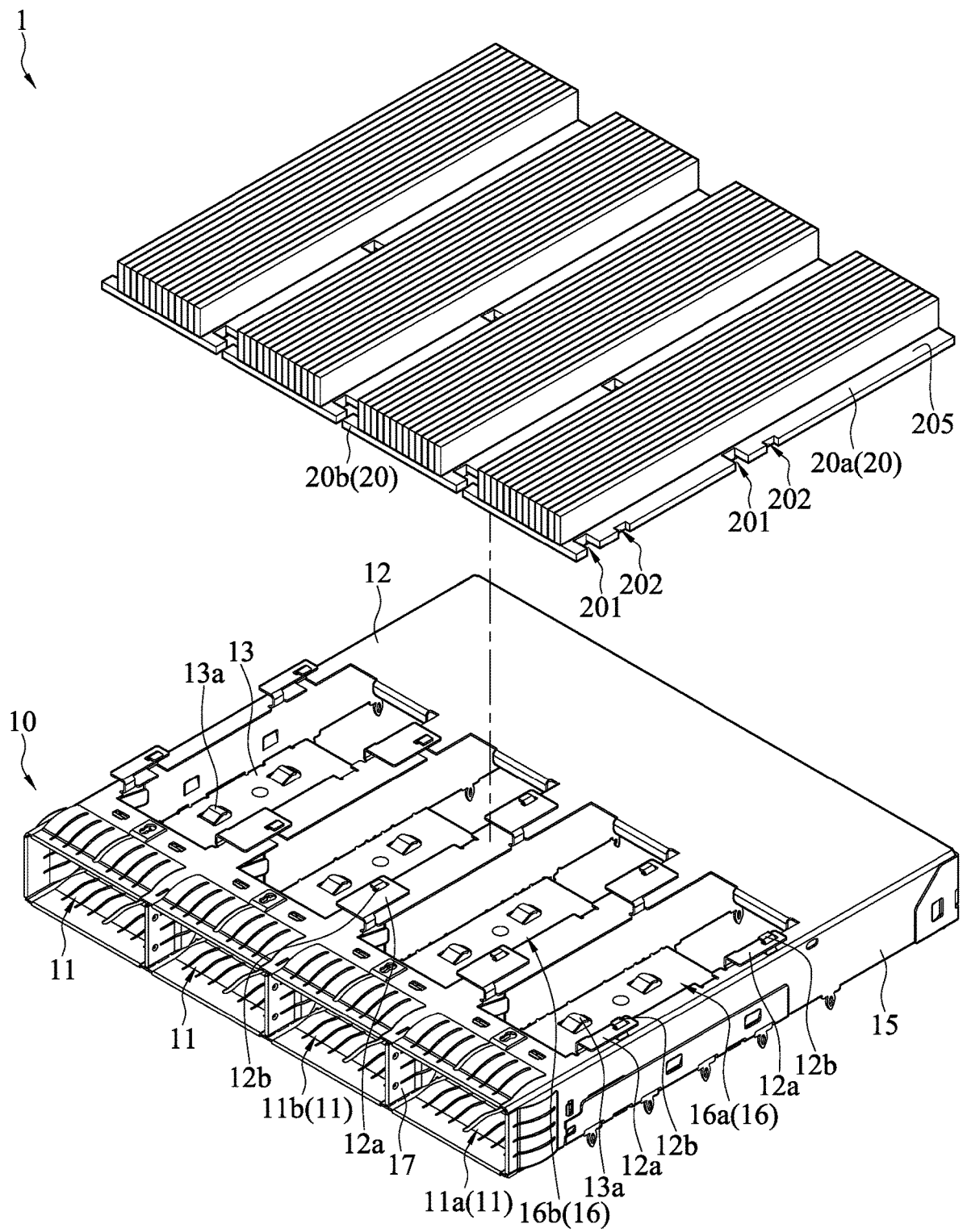
FIG. 2 is a schematic breakdown diagram of the connector of FIG. 1.

Referring to FIG. 1 and FIG. 2, a connector 1 includes a cage 10 and heat-radiation elements 20. Hereupon, the cage 10 includes a top wall 12, and the top wall 12 of the cage 10 is provided with openings 16.

The cage 10 further includes a plurality of engaging structures (hereinafter referred to as first engaging structures 12a), and the first engaging structures 12a extend from the top wall 12 of the cage 10 toward an outside of the cage 10 at peripheries of the openings 16. Hereupon, the top wall 12 and the first engaging structures 12a may be integrally formed. In other words, the first engaging structures 12a are formed by cutting and bending a plate of the top wall 12. The heat-radiation elements 20 are disposed on the top wall 12 of the cage 10 corresponding to the openings 16. Specifically, when the heat-radiation elements 20 are assembled on the cage 10, the heat-radiation elements 20 cover the openings 16. Side walls of the heat-radiation elements 20 are provided with one or more notches (hereinafter referred to as first notches 201). In other words, the side walls of the heat-radiation elements 20 are depressed towards inner sides to form the first notches 201 enabling upper walls of the heat-radiation elements 20 to communicate with lower walls and being opened in side edges. The first notches 201 correspond to the first engaging structure 12a respectively. When the heat-radiation elements 20 are assembled on the cage 10, all the first engaging structures 12a pass through the corresponding first notches 201 to engage the heat-radiation elements 20 on the top wall 12 of the cage 10. Based on this, increasing an overall cost of the connector 1 due to additional fixing parts can be avoided, and a displacement degree of the heat-radiation elements 20 can further be lowered so as to avoid affecting a heat radiation effect and/or an effect of restraining electromagnetic interference (EMI). Hereupon, the cage 10 is provided with receiving cavities 11 laterally opened, and the receiving cavities 11 allow mating connectors 30 in pluggable fit with the connector 1 to be inserted. Supporting structures 13a are disposed at bottoms of the receiving cavities 11. When the mating connectors 30 are inserted into the receiving cavities 11, bottoms of the mating connectors 30 are supported by the supporting structures 13a, tops of the mating connectors 30 abut against the heat-radiation elements 20 through the openings 16, and the heat-radiation elements 20 remain substantially stationary. Based on this, good contact can be provided for the heat-radiation elements 20 and the mating connectors 30 to improve the heat radiation effect, and the effect of the overall connector 1 on restraining electromagnetic interference can be further improved.

Figure 3:
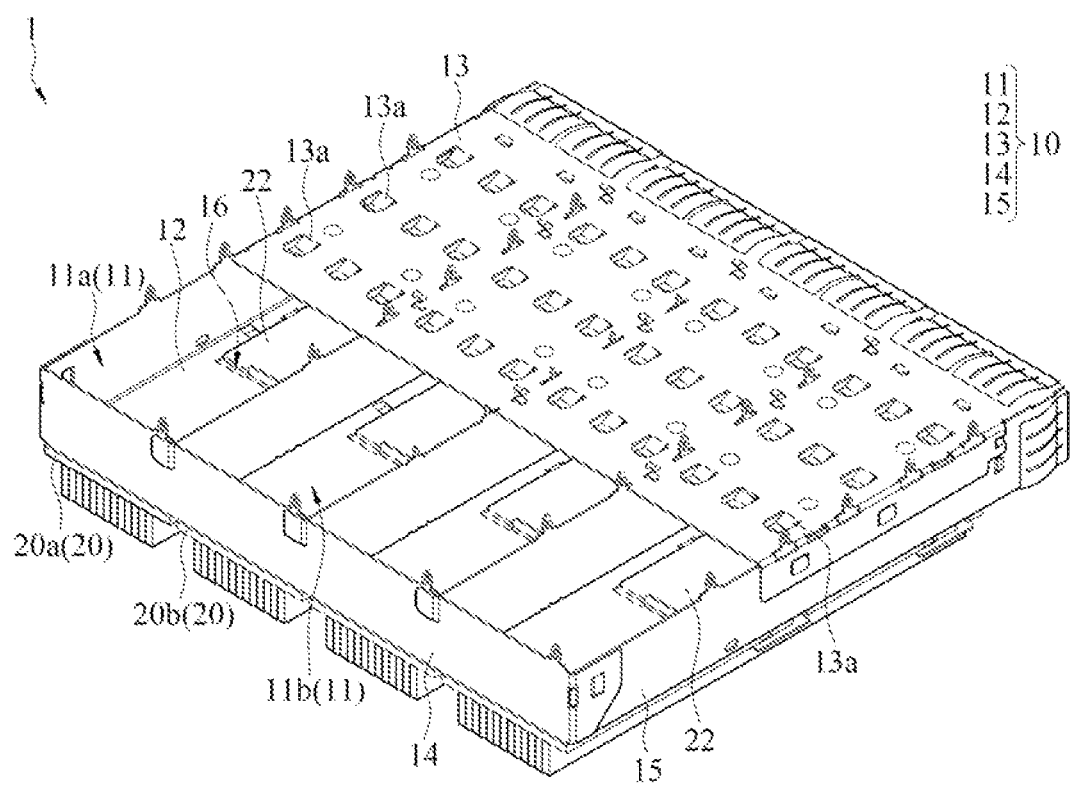
FIG. 3 is a schematic stereoscopic diagram of the connector of FIG. 1 from a lower side view angle.

In some embodiments, referring to FIG. 1 to FIG. 3, the cage 10 includes the top wall 12, a bottom wall 13, a rear wall 14 and two side walls 15. The two side walls 15 are opposite to each other and are coupled between the top wall 12 and the bottom wall 13. The rear wall 14 is coupled among the top wall 12, the bottom wall 13 and the two side walls 15. Hereupon, the receiving cavities 11 with openings being located in an opposite side of the rear wall 14 are defined by the top wall 12, the bottom wall 13, the rear wall 14 and the two side walls 15.

In some embodiments, the bottom wall 13 and the supporting structures 13a may be integrally formed. In other words, the supporting structures 13a are formed by extending of the bottom wall 13 of the cage 10 towards the receiving cavities 11. For example, the supporting structures 13a may be small sheets bulging from a plate of the bottom wall 13 towards the receiving cavities 11.

Figure 4:
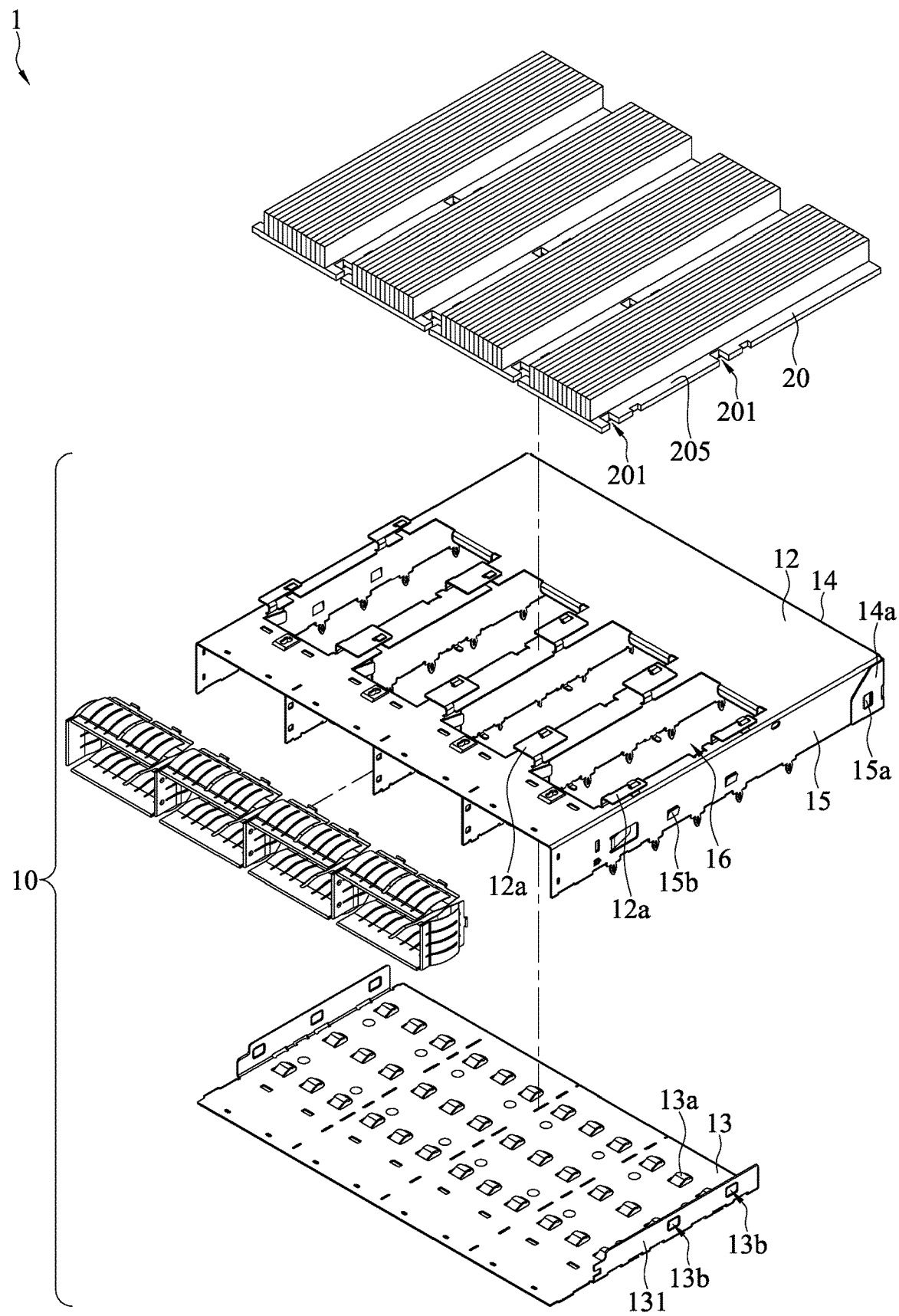
FIG. 4 is a schematic exploded diagram of one demonstrative example of a cage of FIG. 1.

In one demonstrative example, referring to FIG. 4, the top wall 12, the rear wall 14 and the two side walls 15 may be an integrally-formed upper cage. In other words, the upper cage is formed by bending a plate and buckling edges through buckling structures (such as bulge 15a and buckling hole 14a which are mutually buckled) matched on the plate. The bottom wall 13 and buckling elements 131 (such as the buckling elements provided with buckling holes 13b) constitute a lower cage. In other words, the lowercage is formed by bending two opposite side edges of a plate. Hereupon, the upper cage and the lower cage may be mutually buckled into the cage 10 with the receiving cavities 11 through buckling structures (such as mutually embedded bulges 15b and buckling holes 13b) matched on the upper cage and the lower cage. Hereupon, the first engaging structures 12a extend from the upper cage, and the supporting structures 13a extend from the lower cage.

In another demonstrative example, the top wall 12, the bottom wall 13, the rear wall 14 and the two side walls 15 may be integrally formed (not shown in the figures). In other words, the cage 10 is formed by bending a plate and buckling edges through buckling structures matched on the plate. In some embodiments, the cage 10 may be a metal cage.

It should be understood that hereupon, although the single-layer receiving cavities 11 are taken as an example for detailed description, the present invention is not limited to this. According to actual demands, the cage 10 may be partitioned into an upper chamber and a lower chamber by an interlayer, so that the cage 10 is provided with a plurality of up-down configured receiving cavities 11 to allow a plurality of mating connectors 30 to be inserted. When the cage 10 is provided with the plurality of up-down configured receiving cavities 11 (not shown in the figures), bottoms of all the receiving cavities 11 are provided with supporting structures 13a respectively. Hereupon, the supporting structures 13a at the bottoms of the upper receiving cavities 11 may be formed by extending of a top wall of the interlayer towards the upper receiving cavities 11, and the supporting structures 13a at the bottoms of the lower receiving cavities 11 may be formed by extending of the bottom wall 13 of the cage 10 towards the lower receiving cavities 11.

In some embodiments, the first engaging structures 12a are respectively located on two opposite side edges of the openings 16. Correspondingly, the first notches 201 are respectively formed on two opposite side walls of the heat-radiation elements 20. Based on this, the heat-radiation elements 20 may be fixed to the cage 10 more stably. In some demonstrative examples, each of the two opposite side edges of the openings 16 is provided with the plurality of first engaging structures 12a, and each of the two opposite side walls of the heat-radiation elements 20 is also provided with the plurality of first engaging structures 12a correspondingly.

Figure 5:
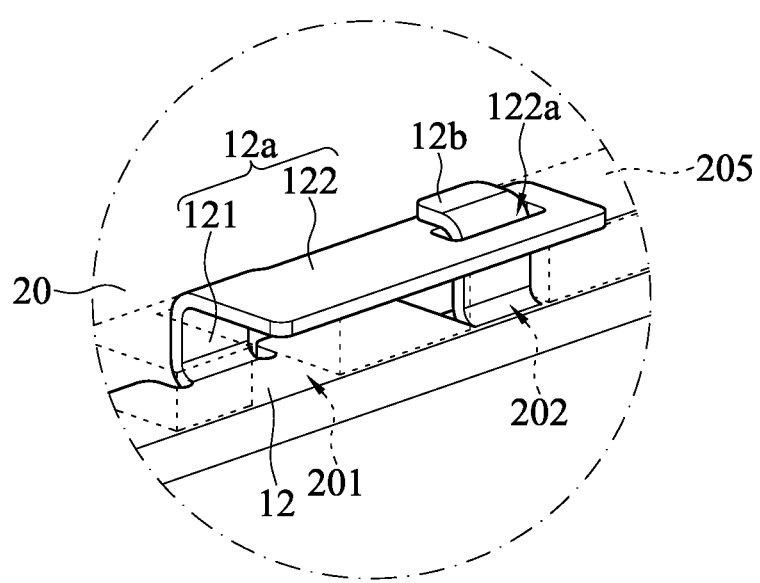
FIG. 5 is a schematic enlarged diagram of an area A of FIG. 1.

In some embodiments, referring to FIG. 1 and FIG. 5, the first engaging structures 12a include upward structures 121 and bent sheet structures 122. The upward structures 121 extend upwards from the top wall 12 of the cage 10, and the bent sheet structures 122 extend from the upward structures 121. In other words, the first engaging structures 12a are sheets formed by cutting and then bending the top wall 12 of the cage 10. The upward structures 121 are sheet sections standing on the top wall 12 after the top wall 12 of the cage 10 is cut, that is, the sheet sections stand on the top wall 12, and one end of each of the sheet sections is connected with the top wall 12. The bent sheet structures 122 are sections formed after free ends (namely the other ends of the sheets relative to a junction with the top wall 12) of the above-mentioned sheets. When the heat-radiation elements 20 are disposed on the top wall 12 of the cage 10, the upward structures 121 are correspondingly disposed in the first notches 201, and the bent sheet structures 122 are crimped with top surfaces 205 of the heat-radiation elements 20.

In some embodiments, referring to FIG. 1 and FIG. 5, one or more other engaging structures (hereinafter referred to as second engaging structures 12b) further extend from the top wall 12 of the cage 10 towards the outside of the cage 10 at the peripheries of the openings 16. Each second engaging structure 12b corresponds to one of the first engaging structures 12a. Each second engaging structure 12b is adjacent to the corresponding first engaging structure 12a. The side walls of the heat-radiation elements 20 are further provided with at least one other notch (hereinafter referred to as second notches 202). The second notches 202 correspond to the second engaging structures 12b respectively. Each second engaging structure 12b passes through the corresponding second notch 202 to be crimped with the bent sheet structure 122 of the adjacent first engaging structure 12a. Crimping may be that part of areas of the second engaging structures 12b are crimped with the bent sheet structures 122 of the adjacent first engaging structures 12a. For another example, the bent sheet structures 122 are provided with openings 122a. The openings 122a penetrate through the bent sheet structures 122. All the second engaging structures 12b stand on the top wall 12 of the cage 10 and extend upwards to pass through the openings 122a. Hereupon, one end of each second engaging structure 12b is connected to the top wall 12 of the cage 10, and the other end of each second engaging structure 12b passes through the opening 122a of the corresponding first engaging structure 12a and then is bent so as to be crimped with the bent sheet structure 122 of the corresponding first engaging structure 12a. In some embodiments, the second engaging structures 12b are sheets standing on the top wall 12 after the top wall 12 of the cage 10 is cut. Moreover, free ends (namely the other ends of the sheets relative to a junction with the top wall 12) of the above-mentioned sheets may be bent and press on the bent sheet structures 122. In other words, one end of each of the second engaging structures 12b is connected with the top wall 12. The second engaging structures 12b extend in a direction away from the top wall 12 and pass through the corresponding second notches 202 and the openings 122a in the corresponding bent sheet structures 122. The other ends of the second engaging structures 12b are clasped on the bent sheet structures 122 on side edges of the second notches 202.

Figure 6:
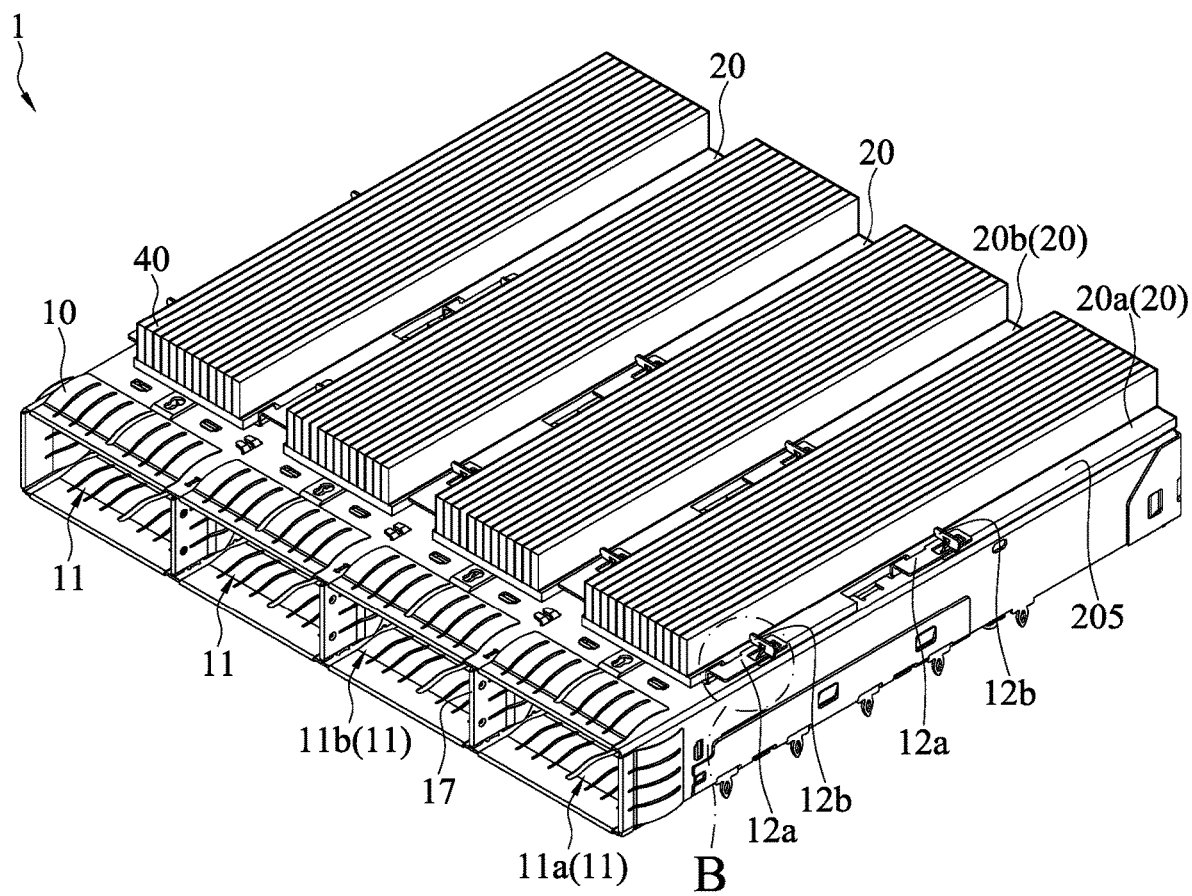
FIG. 6 is a schematic stereoscopic diagram of a connector of another embodiment.
Figure 7:
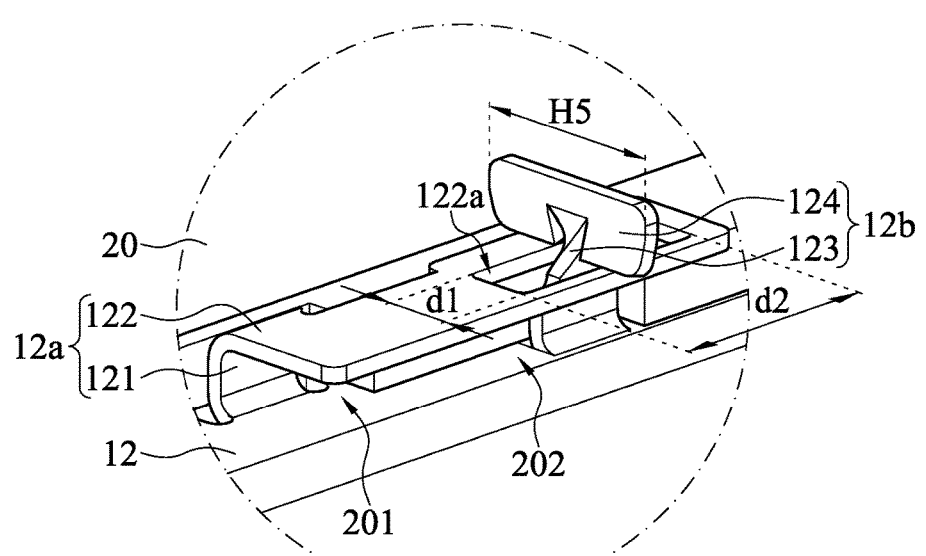
FIG. 7 is a schematic enlarged diagram of an area B of FIG. 6.

In some embodiments, referring to FIG. 6 and FIG. 7, each second engaging structure 12b may include a first sheet structure 123 and a second sheet structure 124. The first sheet structures 123 extend upwards from the top wall 12 of the cage 10, and the second sheet structures 124 extend from the first sheet structures 123. When the heat-radiation elements 20 are disposed on the top wall 12 of the cage 10, the first sheet structures 123 pass through the corresponding second notches 202 and are twisted, so that side wings of the second sheet structures 124 are engaged on the corresponding bent sheet structures 122. For example, the bent sheet structures 122 are provided with openings 122a. The openings 122a penetrate through the bent sheet structures 122. All the first sheet structures 123 stand on the top wall 12 of the cage 10 and extend upwards to pass through the openings 122a in the corresponding bent sheet structures 122. After the second sheet structures 124 pass through the openings 122a in the corresponding bent sheet structures 122 and are located above the corresponding bent sheet structures 122, the first sheet structures 123 are twisted, so that the second sheet structures 124 connected to the first sheet structures 123 rotate by an angle as well, and thus the two side wings of the second sheet structures 124 are buckled on the bent sheet structures 122 at two opposite side edges of the openings 122a. In other words, the openings 122a have at least two diameters d1 and d2. A thickness of each second sheet structure 124 is less than the diameter d1, and a width H5 of each second sheet structure 124 is greater than the diameter d1 and less than the diameter d2. Therefore, before the second sheet structures 124 rotate, the second sheet structures 124 may pass through the corresponding openings 122a. After the second sheet structures 124 rotate by an angle to enable side edges of the second sheet structures 124 close to the openings 122a to be overlapped with the diameter d1, the two side wings of the second sheet structures 124 exceed the two opposite side edges of the openings 122a and cannot separate from the openings 122a. In one demonstrative example, from a top view, contours of the openings 122a may be rectangles or quasi-rectangles (such as rounded rectangles). At the moment, a length and a width of each opening 122a are the diameter d1 and the diameter d2 respectively.

In some embodiments, the at least one first notch 201 may be located at corners of the heat-radiation elements 20. In some embodiments, the first notches 201 and the second notches 202 of the first engaging structures 12a and the second engaging structures 12b correspondingly and mutually engaged to the first engaging structures 12a may communicate with each other.

Figure 8:
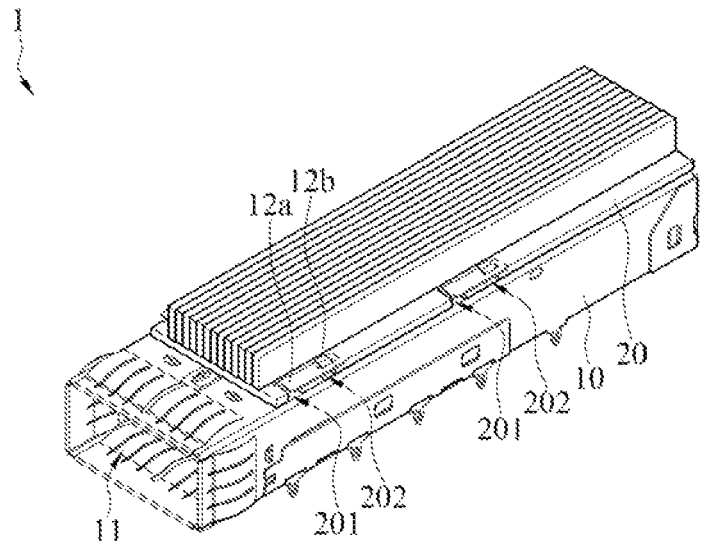
FIG. 8 is a schematic stereoscopic diagram of a connector of yet another embodiment.

In some embodiments, the cage 10 may be monolayer or multilayer, and each layer is provided with a single receiving cavity 11, as shown in FIG. 8.

In some other embodiments, the cage 10 may be monolayer or multilayer, and each layer is provided with a plurality of receiving cavities 11 to allow a plurality of mating connectors 30 to be inserted, as shown in FIG. 1 or FIG. 6. In other words, the cage 10 may be provided with the receiving cavities 11a and the other receiving cavities 11b configured in parallel with the receiving cavities 11a, as shown in FIG. 1 or FIG. 6. In one demonstrative example, referring to FIG. 1 and FIG. 2, the cage 10 may be partitioned into left chambers and right chambers by partition plates 17, so that the cage 10 is provided with the plurality of receiving cavities 11a and 11b configured in parallel. Hereupon, the top wall 12 of the cage 10 is provided with a plurality of openings 16a and 16b corresponding to the receiving cavities 11a and 11b respectively. Specifically, the openings 16a enable the corresponding receiving cavities 11a and an outside of the cage 10 to communicate, and the other openings 16b enable the corresponding receiving cavities 11b and the outside of the cage 10 to communicate. Moreover, a plurality of heat-radiation elements 20 such as heat-radiation elements 20a and 20b are also disposed corresponding to the openings 16a and 16b. The heat-radiation elements 20a are located on the top wall 12 of the cage 10 corresponding to the openings 16a, and the other heat-radiation elements 20b are located on the top wall 12 of the cage 10 corresponding to the openings 16b.

Figure 9:
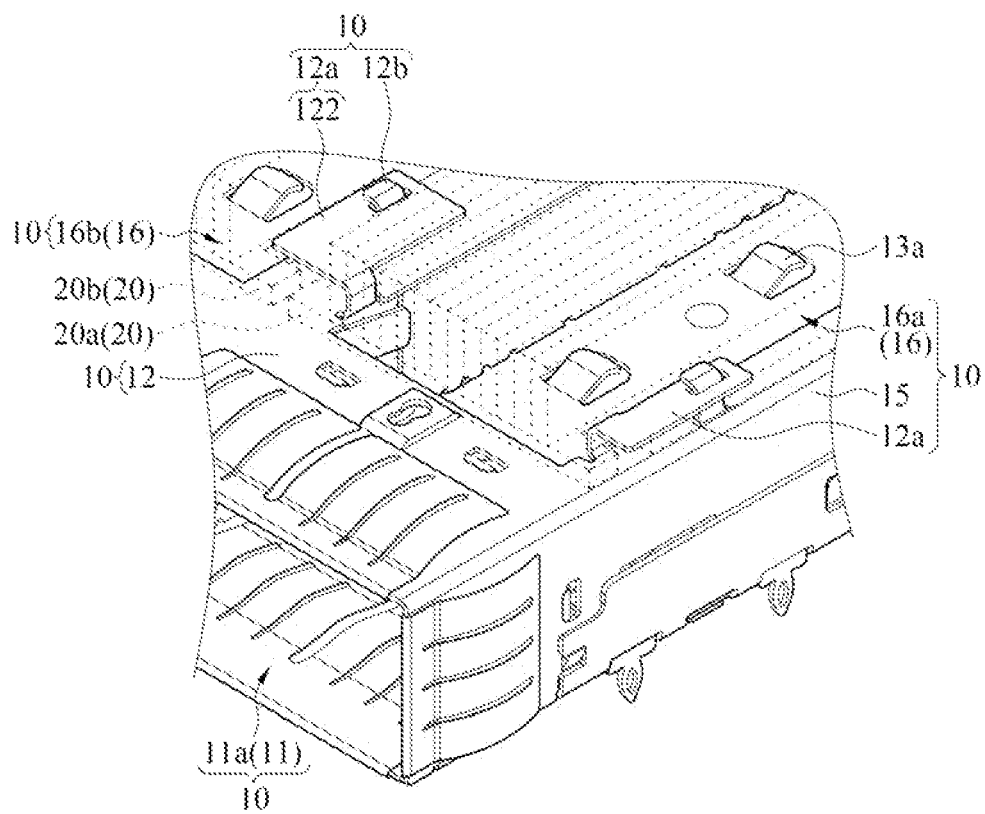
FIG. 9 is a local enlarged drawing of the connector of FIG. 1.

In some embodiments, when the cage 10 is provided with the plurality of receiving cavities 11a and 11b configured in parallel, a shared first engaging structure 12a is disposed between every two adjacent openings 16a and 16b. In other words, the heat-radiation elements 20a and 20b are disposed on the top wall 12 of the cage 10, and a bent sheet structure 122 of the first engaging structure 12a located between the two adjacent openings 16a and 16b are simultaneously crimped with top surfaces 205 of the two heat-radiation elements 20a and 20b corresponding to the two openings 16a and 16b, as shown in FIG. 1 and FIG. 9.

Figure 10:
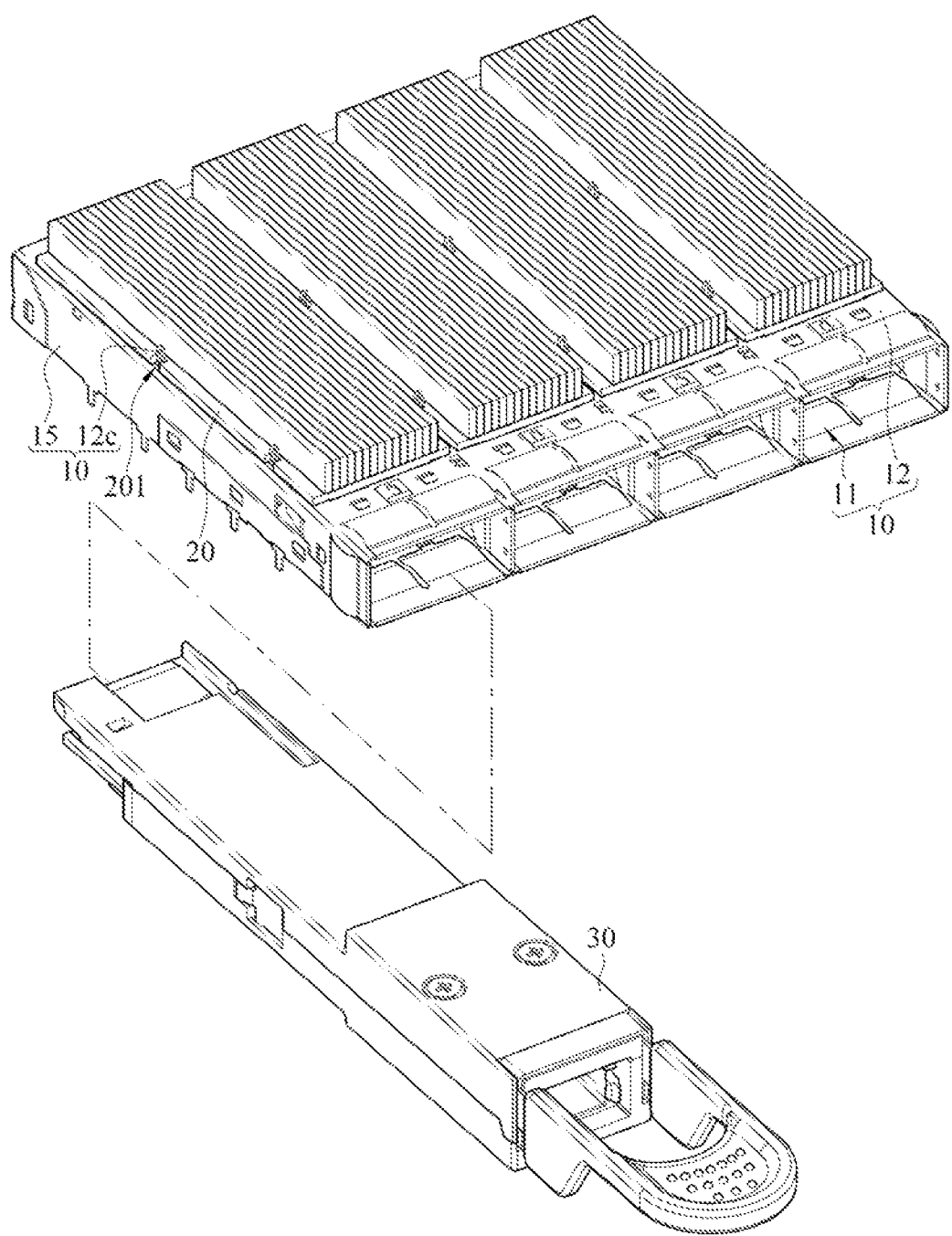
FIG. 10 is a schematic stereoscopic diagram of a connector of yet another embodiment.
Figure 11:
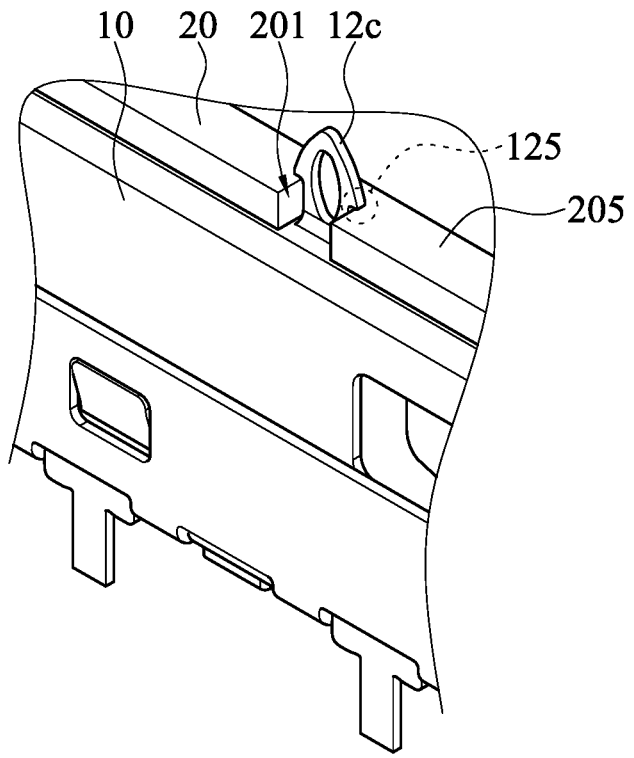
FIG. 11 is an enlarged schematic diagram of an snap structure of FIG. 10.
Figure 12:
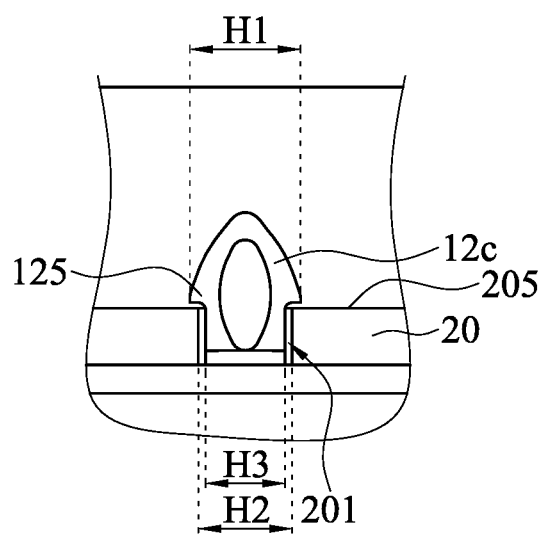
FIG. 12 is a side view of the snap structure of FIG. 11.

In other embodiments, all the first engaging structures may be snap structures 12c extending upwards from the top wall 12 of the cage 10, and the snap structures 12c are engaged by the corresponding first notches 201, as shown in FIG. 10 and FIG. 11. In one demonstrative example, each snap structure 12c may be of a fisheye structure. An outer contour of each snap structures 12c may be in an arrowhead shape. Each of the snap structures 12c comprises two hook structures 125 extending outwardly, the hook structures 125 are crimped with top surfaces 205 of the heat-radiation element 20. Moreover, referring to FIG. 10 to FIG. 12, the width H1 between two hook structures of the snap structure 12c is greater than a width H2 of the corresponding first notch 201, and a width H3 of the bottom part of the snap structure 12c is equal to or less than the width H2 of the corresponding first notch 201.

Figure 13:
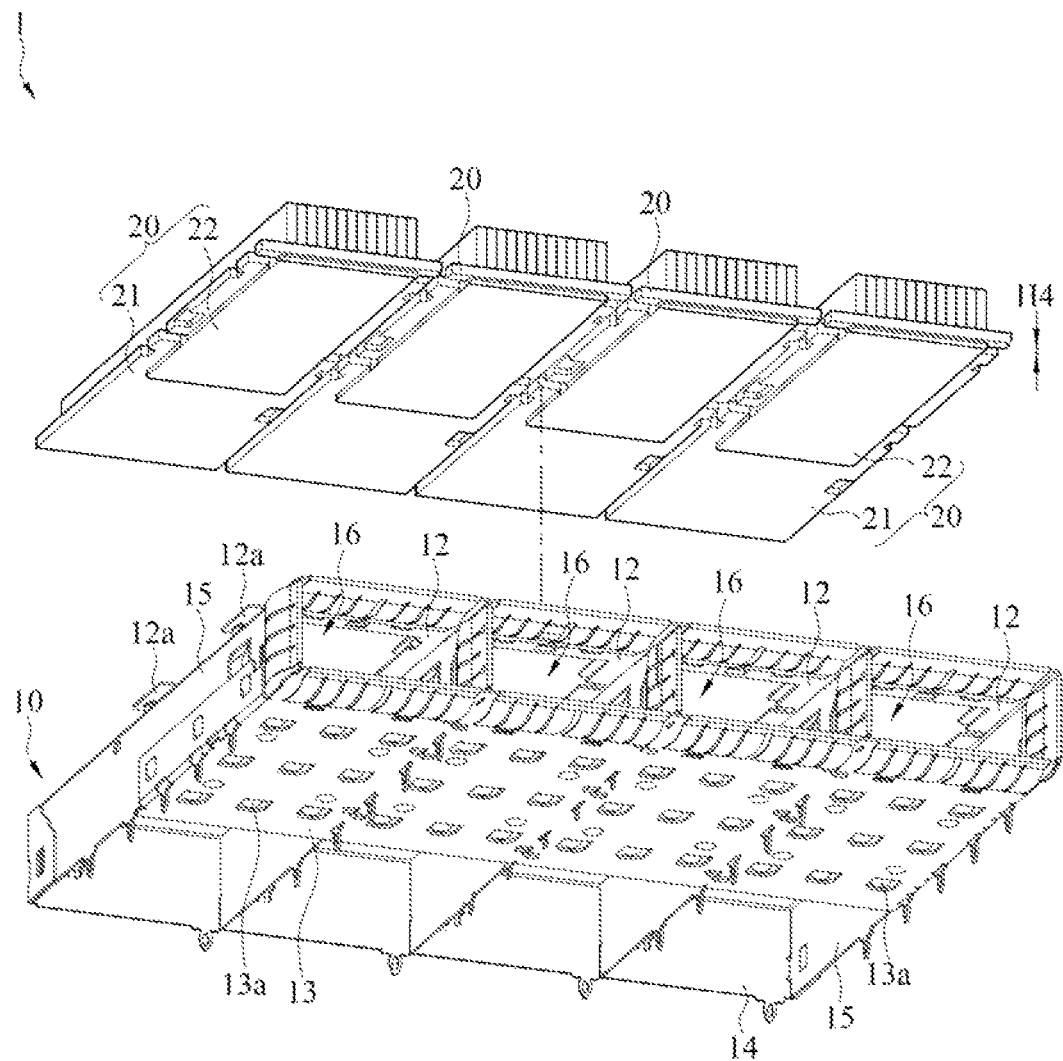
FIG. 13 is a schematic breakdown diagram of the connector of FIG. 1 from the lower side view angle.

In some embodiments, referring to FIG. 3 and FIG. 13, each heat-radiation element 20 is provided with a contact element 22. The contact elements 22 are located at bottoms of plate bodies 21 of the heat-radiation elements 20. Specifically, the contact elements 22 are plates formed by outward protruding of bottom walls of the plate bodies 21 of the heat-radiation elements 20. Positions of the contact elements 22 on the plate bodies 21 of the heat-radiation elements 20 correspond to the openings 16 corresponding to the contact elements 22. Referring to FIG. 1, FIG. 3 and FIG. 13, when the heat-radiation elements 20 are disposed on the top wall 12 of the cage 10, the plate bodies 21 make contact with the top wall 12, and the contact elements 22 extend into the corresponding openings 16. Therefore, when the mating connectors 30 are inserted into the receiving cavities 11, the mating connectors 30 are supported by the supporting structures 13a, so that the mating connectors 30 make contact with the contact elements 22 of the heat-radiation elements 20 through the corresponding openings 16. In some embodiments, the contact elements 22 may be embedded into the corresponding openings 16. In some embodiments, a thickness H4 of each contact element 22 is not less than a possible displacement generated when the mating connectors 30 abut against the heat-radiation elements 20. The heat-radiation elements 20 remain substantially stationary when tops of the mating connectors 30 abut against the heat-radiation elements 20 through the openings 16 in the cage 10. In some embodiments, remaining substantially stationary is to only bear the displacement of about 0.1 mm at most. Therefore, under the condition that the above-mentioned heat-radiation elements 20 remain substantially stationary, considering a process technology and allowable tolerance, the thickness of the contact elements 22 is further decreased, and the thickness of the contact elements 22 may be 0.25 mm to 0.6 mm. To sum up, displacement of the heat-radiation elements 20 caused by the mating connectors 30 abutting against the heat-radiation elements 20 can be avoided effectively, then the thickness of the contact elements 22 is decreased, and the heat radiation effect of the heat-radiation elements 20 is improved.

In some embodiments, referring to FIG. 1, FIG. 6 or FIG. 8, the connector 1 may further include a plurality of heat-radiation fins 40. The heat-radiation fins 40 stand on top surfaces 205 of the heat-radiation elements 20. Based on this, a heat radiation area is increased.

To sum up, as for the connector of any one of the embodiments, a large amount of heat generated during using of the connector 1 is quickly dissipated into air through the heat-radiation elements 20 so as to improve the heat radiation effect. Hereupon, as for the connector of any one of the embodiments, the heat-radiation elements 20 are fixed to the cage 10 through the engaging structures (12a and/or 12b) directly formed on a body of the cage 10 and the notches (201 and/or 202) in bodies of the heat-radiation elements 20, in this way, increasing an overall cost of the connector 1 due to additional fixing parts can be avoided, and a displacement degree of the heat-radiation elements 20 can further be lowered so as to avoid affecting the heat radiation effect and/or an effect of restraining EMI. Moreover, as for the connector of any one of the embodiments, the heat-radiation elements 20 remain substantially stationary when the tops of the mating connectors 30 of the connector abut against the heat-radiation elements 20 through the openings 16 in the cage 10, in this way, good contact can be provided for the heat-radiation elements 20 and the mating connectors 30 to improve the heat radiation effect, and the effect of the overall connector 1 on restraining EMI can be further improved.

What is claimed is:

1. A connector, comprising:
a cage, wherein a top wall of the cage comprises an opening, and a plurality of first engaging structures extends from the top wall of the cage toward an outside of the cage at a periphery of the opening; and
a heat-radiation element, on the top wall of the cage corresponding to the opening, wherein a plurality of first notches correspond to the plurality of first engaging structures and are disposed on side walls of the heat-radiation element, and all of the plurality of first engaging structures pass through the corresponding first notches to engage the heat-radiation element on the top wall of the cage;
wherein the cage comprises a receiving cavity allowing a mating connector to be inserted and a supporting structure disposed at a bottom of the receiving cavity; and
wherein when the mating connector is inserted into the receiving cavity, a bottom of the mating connector is supported by the supporting structure, a top of the mating connector abuts against the heat-radiation element through the opening, and the heat-radiation element remains substantially stationary,
wherein each first engaging structure comprises an upward structure extending upwards from the top wall of the cage and a bent sheet structure extending from the upward structure, and when the heat-radiation element is disposed on the top wall of the cage, the upward structures are correspondingly disposed in the first notches, and the bent sheet structures are crimped with top surfaces of the heat-radiation element.

2. The connector according to claim 1, wherein the heat-radiation element comprises a contact element extending into the opening, and when the mating connector is inserted into the receiving cavity, the top of the mating connector abuts against the contact element through the opening.

3. The connector according to claim 2, wherein a thickness of the contact element is 0.25 mm to 0.6 mm.

4. The connector according to claim 1, wherein the supporting structure is formed by extending of a bottom wall of the cage towards the receiving cavity.

5. The connector according to claim 1, wherein the cage comprises an upper cage and a lower cage, the first engaging structures extend from the upper cage, and the supporting structure extends from the lower cage.

6. The connector according to claim 1, wherein at least one second engaging structure further extends from the top wall of the cage toward the outside of the cage at the periphery of the opening, each second engaging structure is adjacent to one of the first engaging structures, the side walls of the heat-radiation element are further provided with at least one second notch corresponding to the at least one second engaging structure, and each second engaging structure passes through the corresponding second notch to be crimped with the bent sheet structure of the adjacent first engaging structure.

7. The connector according to claim 1, wherein at least one second engaging structure further extends from the top wall of the cage toward the outside of the cage at the periphery of the opening, each second engaging structure is adjacent to one of the first engaging structures, the side walls of the heat-radiation element are further provided with at least one second notch corresponding to the at least one second engaging structure, each second engaging structure comprises a first sheet structure extending upwards from the top wall of the cage and a second sheet structure extending from the first sheet structure, and when the heat-radiation element is disposed on the top wall of the cage, the first sheet structures pass through the corresponding second notches and are twisted, so that side wings of the second sheet structures are engaged on the corresponding bent sheet structures.

8. A connector, comprising:
a cage, wherein a top wall of the cage comprises an opening, and a plurality of first engaging structures extends from the top wall of the cage toward an outside of the cage at a periphery of the opening; and
a heat-radiation element, on the top wall of the cage corresponding to the opening, wherein a plurality of first notches correspond to the plurality of first engaging structures and are disposed on side walls of the heat-radiation element, and all of the plurality of first engaging structures pass through the corresponding first notches to engage the heat-radiation element on the top wall of the cage;
wherein the cage comprises a receiving cavity allowing a mating connector to be inserted and a supporting structure disposed at a bottom of the receiving cavity; and
wherein when the mating connector is inserted into the receiving cavity, a bottom of the mating connector is supported by the supporting structure, a top of the mating connector abuts against the heat-radiation element through the opening, and the heat-radiation element remains substantially stationary,
wherein all the first engaging structures are snap structures extending upwards from the top wall of the cage, all the snap structures are engaged by the corresponding first notches, each of the snap structures comprises two hook structures extending outwardly, and the hook structures are crimped with top surfaces of the heat-radiation element.

9. The connector according to claim 1, wherein the cage comprises another receiving cavity allowing another mating connector to be inserted and configured in parallel with the receiving cavity, the top wall of the cage comprises another opening enabling the outside of the cage and the another receiving cavity to communicate, and the connector further comprises another heat-radiation element located on the top wall of the cage corresponding to the another opening.

10. The connector according to claim 9, wherein the at least one first engaging structure is located between the two openings, each of the at least one first engaging structure comprises an upward structure extending upwards from the top wall of the cage and a bent sheet structure extending from the upward structure, and the bent sheet structure of the at least one first engaging structure is simultaneously crimped with top wall-s surfaces of the two heat-radiation elements corresponding to the two openings.

11. The connector according to claim 1, wherein the cage comprises the top wall and two side walls, and the two side walls are opposite to each other and are coupled to the top wall.

12. The connector according to claim 8, wherein a width between two hook structures of the snap structure is greater than a width of the corresponding first notch, and a width of a bottom part of the snap structure is equal to or less than the width of the corresponding first notch.

\* \* \* \* \*